United States Patent
Funane et al.

(10) Patent No.: US 8,483,000 B2
(45) Date of Patent: Jul. 9, 2013

(54) SEMICONDUCTOR DEVICE

(75) Inventors: Kiyotada Funane, Nanae (JP); Yuta Yanagitani, Nanae (JP); Shinji Tanaka, Itami (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 0 days.

(21) Appl. No.: 13/587,047

(22) Filed: Aug. 16, 2012

(65) Prior Publication Data

US 2012/0307551 A1    Dec. 6, 2012

Related U.S. Application Data

(63) Continuation of application No. 12/838,466, filed on Jul. 18, 2010, now Pat. No. 8,259,524.

(30) Foreign Application Priority Data

Aug. 6, 2009  (JP) ................................. 2009-183349

(51) Int. Cl.
  *G11C 7/02*    (2006.01)
  *G11C 7/10*    (2006.01)
  *G11C 8/00*    (2006.01)

(52) U.S. Cl.
  USPC .............. 365/210.14; 365/189.04; 365/210.1; 365/210.15; 365/230.05

(58) Field of Classification Search
  USPC .................................................. 365/210.14
  See application file for complete search history.

(56) References Cited

U.S. PATENT DOCUMENTS

| | | | |
|---|---|---|---|
| 6,982,914 B2 | 1/2006 | Ohtsuki et al. | |
| 7,136,318 B2 | 11/2006 | Ohtsuki et al. | |
| 7,248,523 B2 | 7/2007 | Ohtsuki et al. | |
| 7,535,784 B2 | 5/2009 | Tohata et al. | |
| 7,613,055 B2 * | 11/2009 | Chang | 365/194 |
| 7,839,697 B2 * | 11/2010 | Ishikura et al. | 365/189.04 |
| 2007/0103954 A1 | 5/2007 | Ikeda | |

FOREIGN PATENT DOCUMENTS

JP    2007-128603 A    5/2007

* cited by examiner

*Primary Examiner* — Son Mai
(74) *Attorney, Agent, or Firm* — Miles & Stockbridge P.C.

(57) ABSTRACT

The present invention is directed to provide a semiconductor device having a dual-port memory circuit in which influence of placement of replica cells exerted on enlargement of chip area is reduced. A memory cell array of a dual-port memory circuit has: a first replica cell array used to respond to an instruction of reading operation from one of dual ports; and a second replica cell array used to respond to an instruction of reading operation from the other dual port. Each of the replica cell arrays has: replica bit lines obtained by mutually short-circuiting parallel lines having a length obtained by cutting, in half, an inversion bit line and a non-inversion bit line of complementary bit lines to which data input/output terminals of a memory cell are coupled; and replica cells coupled to the replica bit lines and having transistor placement equivalent to that of the memory cells.

6 Claims, 10 Drawing Sheets

US 8,483,000 B2

SEMICONDUCTOR DEVICE

CROSS-REFERENCE TO RELATED APPLICATIONS

This application is a continuation of application Ser. No. 12/838,466 filed Jul. 18, 2010 now U.S. Pat. No. 8,259,524. Also the disclosure of Japanese Patent Application No. 2009-183349 filed on Aug. 6, 2009 including the specification, drawings and abstract is incorporated herein by reference in its entirety.

BACKGROUND OF THE INVENTION

The present invention relates to a semiconductor device having a dual-port memory circuit and, more particularly, to a configuration of a replica circuit in the dual-port memory circuit. For example, the invention relates to a technique effectively applied to a system-on-chip (SOC) microcomputer.

In a memory circuit, an internal timing is generated by using a replica circuit including replica cells having the same transistor placement as that of memory cells. For example, a sense amplifying timing for signals read from complementary bit lines can be generated in accordance with characteristics of a memory cell. Without making an operation margin which is fixedly set in advance relatively large, process variations and the like can be handled. Patent document 1 describes an example of using replica memory cells in a single-port SRAM. In the example, a block of replica memory cells is added to an array in which normal memory cells to be selected according to an access address are disposed.

Patent document 1: Japanese Unexamined Patent Publication No. 2007-128603

SUMMARY OF THE INVENTION

The inventors of the present invention have examined the case of applying a technique of generating an internal timing signal by using replica memory cells to a dual-port memory which can be read-accessed in parallel asynchronously. In the technique, it is necessary to add a block of replica memory cells in correspondence with each of dual ports which can be read-accessed in parallel asynchronously. For example, in the case of employing a block of replica memory cells in a single port in correspondence with the original access port, it was found out that the area of the block of replica memory cells occupying in the memory cell array is doubled, the dimension in the arrangement direction of a plurality of complementary bit lines in the memory cell array increases, the memory chip becomes larger and elongated, and mounting to a wiring board or a chip may be hindered.

An object of the present invention is to provide a semiconductor device having a dual-port memory circuit in which influence of placement of replica cells on increase in chip area is reduced.

The above and other objects and novel features of the present invention will become apparent from the description of the specification and appended drawings.

Outline of typical ones of inventions disclosed in the application will be briefly described as follows.

A memory cell array of a dual-port memory circuit has: a first replica cell array used to respond to an instruction of reading operation from one of dual ports; and a second replica cell array used to respond to an instruction of reading operation from the other dual port. Each of the replica cell arrays has: replica bit lines obtained by mutually short-circuiting parallel lines having a length obtained by cutting, in half, an inversion bit line and a non-inversion bit line of complementary bit lines to which data input/output terminals of a memory cell are coupled; and replica cells coupled to the replica bit lines and having transistor placement equivalent to that of the memory cells.

An effect obtained by a representative one of the inventions disclosed in the application will be briefly described as follows.

That is, influence of placement of replica cells in a dual-port memory circuit on increase in chip area can be reduced.

DETAILED DESCRIPTION OF THE PREFERRED EMBODIMENTS

1. Outline of Embodiment

Figure 1:
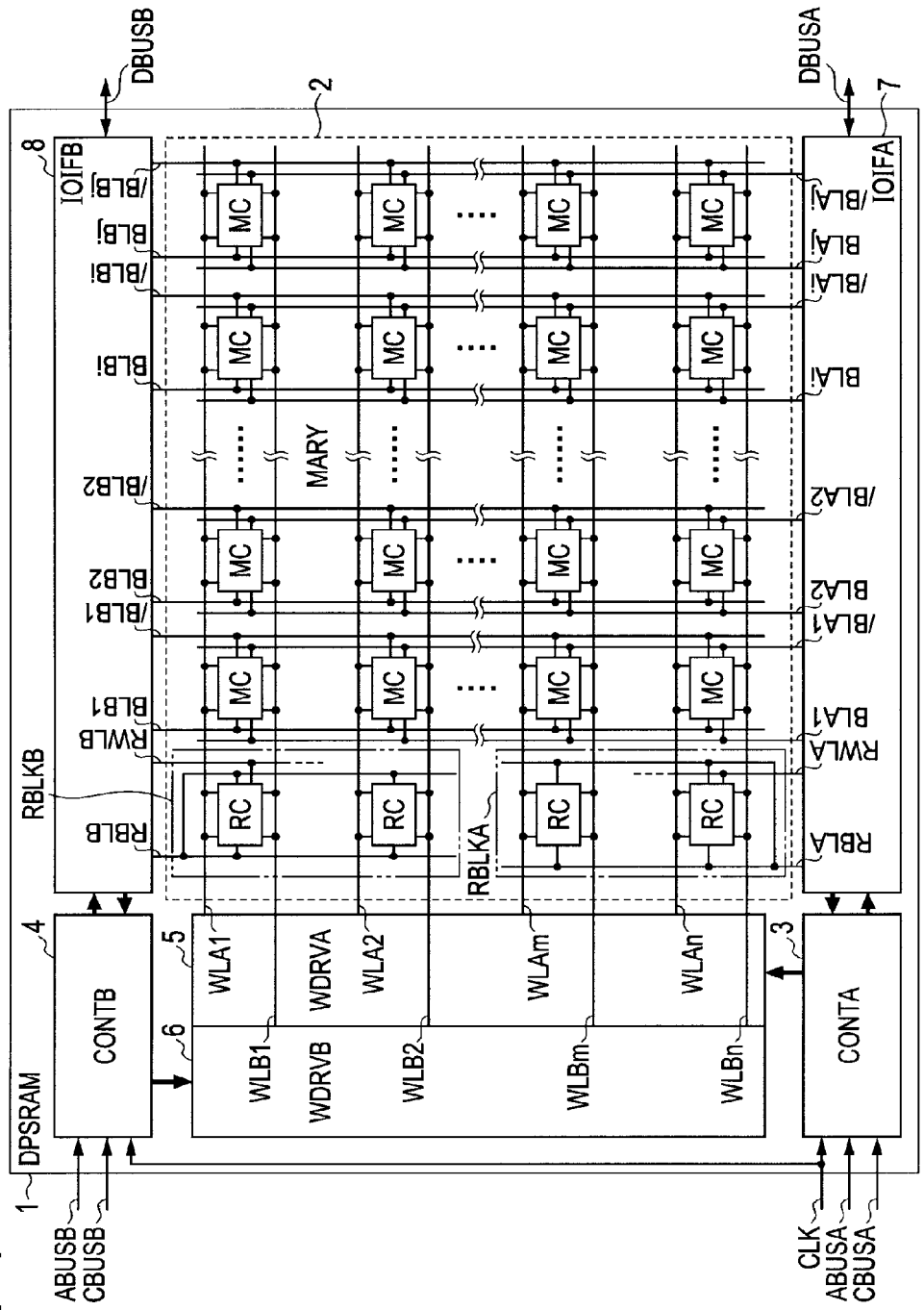
FIG. 1 is a block diagram showing the configuration of a DPSRAM as an example of a dual-port memory circuit of a semiconductor device according to the present invention.

First, outline of a representative embodiment of the invention disclosed in the application will be described. Reference numerals in drawings in parentheses referred to in description of the outline of the representative embodiments just denote components included in the concept of the components to which the reference numerals are designated.

[1] A semiconductor device according to a representative embodiment of the present invention has a dual-port memory circuit (1). The dual-port memory circuit includes a memory cell array (2), first peripheral circuits (3, 5, and 7) forming an access port, and second peripheral circuits (4, 6, and 8) forming another access port. The memory cell array has: first complementary bit lines (BLA1, /BLA1 to BLAj, /BLAj) and first word lines (WLA1 to WLAn) coupled to the first peripheral circuits; second complementary bit lines (BLB1, /BLB1 to BLBj, /BLBj) and second word lines (WLB1 to WLBn) coupled to the second peripheral circuits; a plurality of memory cells (MC) coupled to the first complementary bit lines, the first word lines, the second complementary bit lines, and the second word lines; a first replica bit line (RBLA) and a first replica word line (RWLA) coupled to the first peripheral circuits; a second replica bit line (RBLB) and a second replica word line (RWLB) coupled to the second peripheral circuits; a plurality of replica cells (RC) having transistor placement equivalent to transistor placement of the memory cells and coupled to the first replica bit line and the first replica word line; and a plurality of replica cells (RC) having transistor placement equivalent to transistor placement of the memory cells and coupled to the second replica bit line and the second replica word line. The first replica bit line has a wiring structure that parallel lines having length obtained by cutting an inversion bit line and a non-inversion bit line of the first complementary bit lines in half are mutually short-circuited. The second replica bit line has a wiring structure that parallel lines having length obtained by cutting an inversion bit line and a non-inversion bit line of the second complementary bit lines in half are mutually short-circuited.

With the configuration, each of the replica bit lines has the parallel wiring structure that parallel lines having length obtained by cutting an inversion bit line and a non-inversion bit line of the second complementary bit lines in half are mutually short-circuited. Consequently, the replica bit line has a capacitance component and a resistance component almost equal to wiring capacitance and parasitic capacitance of a single complementary bit line, and has characteristics according to the characteristics of the memory cell and the line due to process variations. Further, in a region equal to the occupation area of a pair of complementary bit lines, both of the first and second replica bit lines can be disposed. Therefore, the influence of the placement of replica cells in the dual-port memory circuit exerted on the chip area can be reduced.

[2] In the semiconductor device of [1], the first replica word line and the first replica bit line and the second replica word line and the second replica bit line are, for example, aligned at one end in a word line extending direction of the memory cell array. Circuits for controlling the replica bit lines and the replica word lines can be disposed collectively on one side in the word line extending direction of the memory cell array.

[3] In the semiconductor device of [2], for example, the first replica word line is disposed parallel to the first replica bit line, and the second replica word line is disposed parallel to the second replica bit line. An empty region in the region of the first and second replica bit lines can be effectively used as the region of disposing the replica word lines.

[4] In the semiconductor device of [3], the memory cell is a static memory cell.

In the semiconductor device of [4], the memory cell has, for example, a CMOS static latch, a pair of first selection switches (Ac1_a, Ac2_a) for selectively coupling a pair of storage nodes (Nt, Nb) of the CMOS static latch to the first complementary bit lines, and a pair of second selection switches (Ac1_b, Ac2_b) for selectively coupling a pair of storage nodes of the CMOS static latch to the second complementary bit lines. A selection terminal of the first selection switch is coupled to the first word line, and a selection terminal of the second selection switch is coupled to the second word line. The replica cell has, for example, the same transistor placement as that of transistors configuring the CMOS static latch, the first selection switch, and the second selection switch of the memory cell. In the replica cell coupled to the first replica bit line, for example, a current path of a transistor (Ac2_b) coupled to one of the short-circuited parallel lines formed as the first replica bit line is set in a cutoff state. A switch state of a transistor (Ac1_a) coupled to the other parallel line is controlled by a trimming signal. A pull-down transistor (Dr1) which is switch-controlled by a first replica word line is coupled to a part of transistors whose switch state is controlled by the trimming signal. A transistor (Dr1) in the cutoff state is coupled to the remaining transistors whose switch state is controlled by the trimming signal. In the replica cell coupled to the second replica bit line, for example, a current path of a transistor (Ac1_a) coupled to one of the short-circuited parallel lines formed as the second replica bit line is set in a cutoff state. The switch state of the transistor (Ac2_b) coupled to the other parallel line is controlled by a trimming signal. A pull-down transistor (Dr2) which is switch-controlled by a first replica word line is coupled to a part of transistors whose switch state is controlled by the trimming signal, and a transistor (Dr2) in the cutoff state is coupled to the remaining transistors whose switch state is controlled by the trimming signal.

With the configuration, the timing of level change in the replica bit line can be adjusted by the operation of selecting the replica word lines in accordance with the number of transistors which are turned on by the trimming circuit.

[6] In the semiconductor device in any of [1] to [5], the first peripheral circuit generates, for example, a first internal timing signal on the basis of a level change in a first replica bit line, caused by selection of the first replica word line before a timing of selecting a first word line when reading operation is instructed. The second peripheral circuit generates, for example, a second internal timing signal on the basis of a level change in a second replica bit line, caused by selection of the second replica word line before a timing of selecting a second word line when reading operation is instructed.

With the configuration, it becomes unnecessary to preliminarily set a large operation margin to handle process variations in each of the access ports.

[7] In the semiconductor device of [6], the first internal timing signal is, for example, a signal of determining a timing of starting a sense amplifying operation of a first complementary bit line. The second internal timing signal is, for example, a signal of determining a timing of starting a sense amplifying operation of a second complementary bit line.

[8] The semiconductor device of any of [1] to [7] may further include, for example, a central processing unit that accesses the dual-port memory circuit.

[9] A semiconductor device according to another embodiment of the present invention has a dual-port memory circuit. The dual-port memory circuit includes a memory cell array, first peripheral circuits forming an access port, and second peripheral circuits forming another access port. The memory cell array has a first replica cell array (RBLKA) used for generating an internal timing at the time of a reading operation instructed by the first peripheral circuit and a second replica cell array (RBLKB) used for generating an internal timing at the time of a reading operation instructed by the second peripheral circuit. Each of the first and second replica cell arrays has replica bit lines (RBLA, RBLB) obtained by mutually short-circuiting parallel lines having length obtained by cutting, in half, an inversion bit line and a non-inversion bit line of complementary bit lines to which data input/output terminals of the memory cell are coupled, and replica cells (RC) coupled to the replica bit lines and having transistor placement equivalent to that of the memory cells.

With the configuration, each of the replica bit lines has the parallel wiring structure that parallel lines having length obtained by cutting an inversion bit line and a non-inversion bit line of the second complementary bit lines in half are mutually short-circuited. Consequently, the replica bit line has a capacitance component and a resistance component almost equal to wiring capacitance and parasitic capacitance of a single complementary bit line, and has characteristics according to the characteristics of the memory cell and the line due to process variations. Further, in a region equal to the occupation area of a pair of complementary bit lines, both of the first and second replica bit lines can be disposed. Therefore, the influence of the placement of replica cells in the dual-port memory circuit exerted on the chip area can be reduced.

[10] In the semiconductor device of [9], the memory cell is a static memory cell.

[11] In the semiconductor device of [10], for example, the first internal timing signal is a signal of determining a timing of starting sense amplifying operation of a memory cell, and the second internal timing signal is a signal of determining a timing of starting sense amplifying operation of a memory cell.

[12] In the semiconductor device of [11], the first and second replica cell arrays are disposed, for example, at one end in the longitudinal direction of the memory cell array. Circuits for controlling the replica bit lines and the replica word lines can be disposed collectively on one side in the word line extending direction of the memory cell array, and the semiconductor device can be suppressed from becoming elongated.

2. Details of Embodiment

The embodiment will be described more specifically.
<DPSRAM>

FIG. 1 illustrates the configuration of a DPSRAM (Dual-Port Static Random Access Memory) as an example of a dual-port memory circuit of a semiconductor device according to the present invention.

A DPSRAM 1 has a memory cell array (MARY) 2, a first memory control unit (CONTA) 3, a first word driver (WDRVA) 5, and a first input/output circuit unit (IOIFA) 7 as first peripheral circuits forming a first access port, and a second memory control unit (CONTA) 4, a second word driver (WDRVB) 6, and a second input/output circuit unit (IOIFB) 8 as second peripheral circuits forming a second access port.

In the memory cell array 2, for example, a plurality of dual-port memory first cells MC are arranged in a matrix in "n" rows and "j" columns, and a plurality of replica cells RC are disposed in "n" rows and one column. As the details will be described later, a part of the replica cells RC is used for generation of an internal timing signal by a timing controller.

WLA1 to WLAn denote word lines for the first access port and are selectively driven by the first word driver 5. WLB1 to WLBn denote word lines for the second access port and are selectively driven by the second word driver 6.

BLA1, /BLA1 to BLAj, /BLAj are complementary bit lines made by non-inversion bit lines and inversion bit lines for the first access port and are coupled to the first input/output circuit unit 7. BLB1, /BLB1 to BLBj, /BLBj are complementary bit lines made by non-inversion bit lines and inversion bit lines for the second access port and are coupled to the second input/output circuit unit 8.

RWLA denotes a replica word line for the first access port, and RBLA denotes a replica bit line for the first access port. For convenience, the replica word lines are coupled to the first input/output circuit unit 7. RWLB denotes a replica word line for the second access port, and RBLB denotes a replica bit line for the second access port. For convenience, the replica word lines are coupled to the second input/output circuit unit 8.

The first memory control unit 3 has an address decoder for decoding an address signal input from an external address bus ABUSA for requesting an access to the first access port, and has a timing controller (not shown) for controlling internal operation on the basis of strobe signals (a read write signal and an access enable signal) input from an external control bus CBUSA, an external clock signal CLK, and the like. A decode signal of a row address signal included in the address signal is given to the first word driver 5. In accordance with the decode signal, the first word driver 5 drives one of the word lines WLA1 to WLAn to a selection level to select the memory cells MC coupled to the word line. A decode signal of a column address signal included in the address signal is given to the first input/output circuit unit 7. The first input/output circuit unit 7 has a column switch circuit (not shown) which selects bit lines of the number according to the number of data input/output bits from the complementary bit lines BLA1, /BLA1 to BLAj, /BLAj and makes them to be conducted to a common data line. The column switch circuit selects bit lines to be conducted to a common data line (not shown) in accordance with the decode signal of the column address signal. In the first input/output circuit unit 7, each common data line is provided with a sense amplifier (not shown) for sense-amplifying read data, and a write amplifier (not shown) for driving a common data line and complementary bit lines conducted to the common data line to the complementary level in accordance with write data. The first input/output circuit unit 7 has a data input buffer (not shown) coupled to the input terminal of the write amplifier, and an external output buffer (not shown) coupled to the output terminal of the sense amplifier. The input terminal of the data input buffer and the output terminal of the external output buffer are coupled to an external data bus DBUSA. The first input/output circuit unit 7 also has a precharge circuit for precharging the complementary bit lines BLA1, /BLA1 to BLAj, /BLAj, and the replica bit line RBLA to a desirable level before start of reading.

The second memory control unit 4 has an address decoder (not shown) for decoding an address signal input from an external address bus ABUSB for requesting an access to the first access port, and has a timing controller (not shown) for controlling internal operation on the basis of strobe signals (a read write signal and an access enable signal) input from an external control bus CBUSB, an external clock signal CLK, and the like. A decode signal of a row address signal included in the address signal is given to the second word driver 6. In accordance with the decode signal, the second word driver 6 drives one of the word lines WLB1 to WLBn to a selection level to select the memory cells MC coupled to the word line. A decode signal of a column address signal included in the address signal is given to the second input/output circuit unit 8. The second input/output circuit unit 8 has a column switch circuit (not shown) which selects bit lines of the number according to the number of data input/output bits from the complementary bit lines BLB1, /BLB1 to BLBj, /BLBj and makes them to be conducted to a common data line. The column switch circuit selects bit lines to be conducted to a common data line (not shown) in accordance with the decode signal of the column address signal. In the second input/output circuit unit 8, each common data line is provided with a sense amplifier (not shown) for sense-amplifying read data, and a write amplifier (not shown) for driving a common data line and complementary bit lines conducted to the common data line to the complementary level in accordance with write data. The first input/output circuit unit 7 has a data input buffer (not shown) coupled to the input terminal of the write amplifier, and an external output buffer (not shown) coupled to the output terminal of the sense amplifier. The input terminal of the data input buffer and the output terminal of the external output buffer are coupled to an external data bus DBUSB. The first input/output circuit unit 7 also has a pre-charge circuit for precharging the complementary bit lines BLB1, /BLB1 to BLBj, /BLBj, and the replica bit line RBLB to a desirable level before start of reading.

The replica bit lines RBLA and RBLB are disposed at one end in the longitudinal direction of the memory cell array 2, particularly, near the first and second memory control units 3 and 4. That is, the replica bit line RBLA (RBLB) is disposed near the first control unit 3 (the second control unit 4) having a timing controller using a change in the replica bit line RBLA (RBLB).

As illustrated in FIG. 1, the replica bit line RBLA has a wiring structure that parallel lines having length obtained by cutting the non-inversion bit line BLAi and the inversion bit line /BLAi of the complementary bit lines in half are mutually short-circuited. The replica word line RWLA is disposed parallel to the replica bit line RBLA. Similarly, the replica bit line RBLB has a wiring structure that parallel lines having length obtained by cutting the non-inversion bit line BLBi and the inversion bit line /BLBi of the complementary bit lines in half are mutually short-circuited. The replica word line RWLB is disposed, for example, parallel to the replica bit line RBLB.

For example, each of the replica bit lines RBLA and RBLB is coupled to the replica cell RC as a component of the dual-port memory from two directions (the right and left directions of the cell). On the base end side of the replica bit line (for example, on the side of the first and second input/output circuit units 7 and 8), one (the cell right side) of the replica bit lines RBLA is short-circuited (coupled) to the other replica bit line RBLA (the cell left side). The replica bit lines are disposed in a U shape so as to surround the replica cell and, further, coupled to the control circuit for driving the replica bit lines. By coupling the replica bit lines on the right and left sides to the halved replica bit lines, total extension of the replica bit lines can be equalized to that of the bit line for the memory cell MC on one side (for example, A side) of the dual port and also the other side (for example, B side). The replica bit line can have a capacitance component and a resistance component almost equal to wiring capacitance and parasitic capacitance of one complementary bit line, and characteristics according to characteristics of a memory cell and a line due to process variations.

<Replica Cell>

Figure 2:
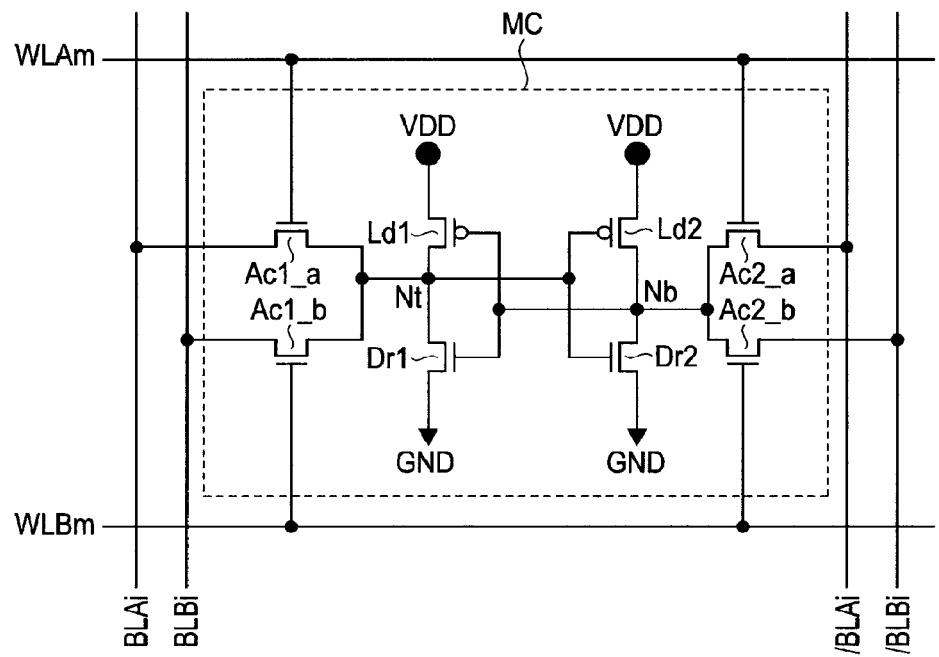
FIG. 2 is a circuit diagram illustrating a memory cell MC of a CMOS static latch type.

Before the explanation of the structure of the replica cell, the structure of the memory cell will be described. For the memory cell MC, for example, a CMOS circuit configuration of FIG. 2 is employed. The memory cell MC shown in the diagram has, as a CMOS static latch, a CMOS inverter in which a storage MOS transistor Dr1 of the n channel type is coupled in series to a load MOS transistor Ld1 of the p channel type, and a CMOS inverter in which a storage MOS transistor Dr2 of the n channel type is coupled in series to a load MOS transistor Ld2 of the p channel type. The input terminal of one of the CMOS inverters is coupled to the output terminal of the other CMOS inverter. Nt denotes a non-inversion storage node, and Nb denotes an inversion storage node. VDD denotes power supply voltage, and GND denotes ground voltage. The non-inversion storage node Nt is coupled to the non-inversion bit line BLAi corresponding to the first access port side via a selection MOS transistor Ac1_a of the n channel type, and is also coupled to the non-inversion bit line BLBi corresponding to the second access port side via a selection MOS transistor Ac1_b of the n channel type. The inversion storage node Nb is coupled to the inversion bit line /BLAi corresponding to the first access port side via a selection MOS transistor Ac2_a of the n channel type, and is also coupled to the inversion bit line /BLBi corresponding to the second access port side via a selection MOS transistor Ac2_b of the n channel type. The gates of the selection MOS transistors Ac1_a and Ac2_a are coupled to the corresponding word line WLAm on the first access port side. The gates of the selection MOS transistors Ac1_b and Ac2_b are coupled to the corresponding word line WLBm on the second access port side.

Figure 3:
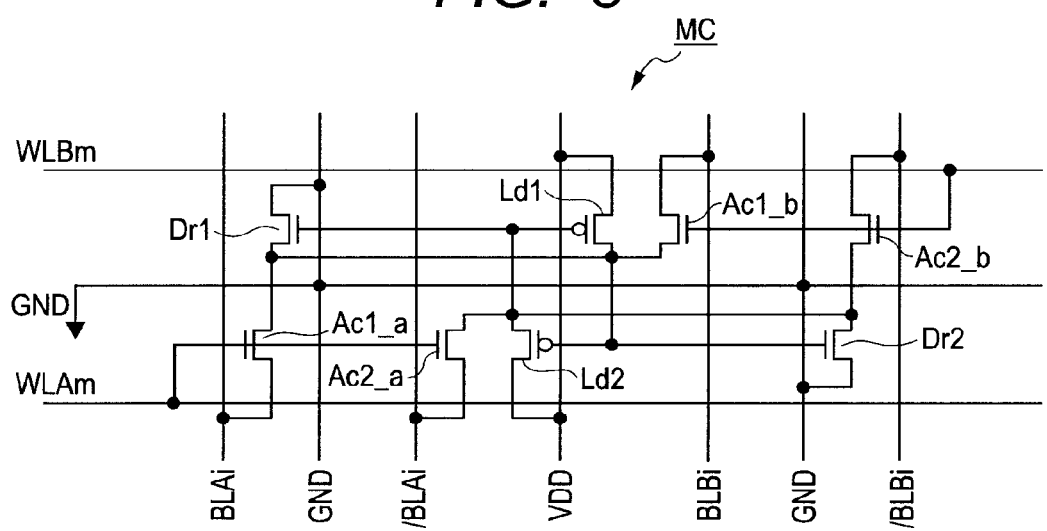
FIG. 3 is a circuit diagram illustrating circuit connection of FIG. 2 by transistor placement equivalent to layout of the memory cell MC.

The circuit connection of FIG. 2 may be illustrated by transistor placement equivalent to the layout of the memory cell MC like FIG. 3.

Figure 4:
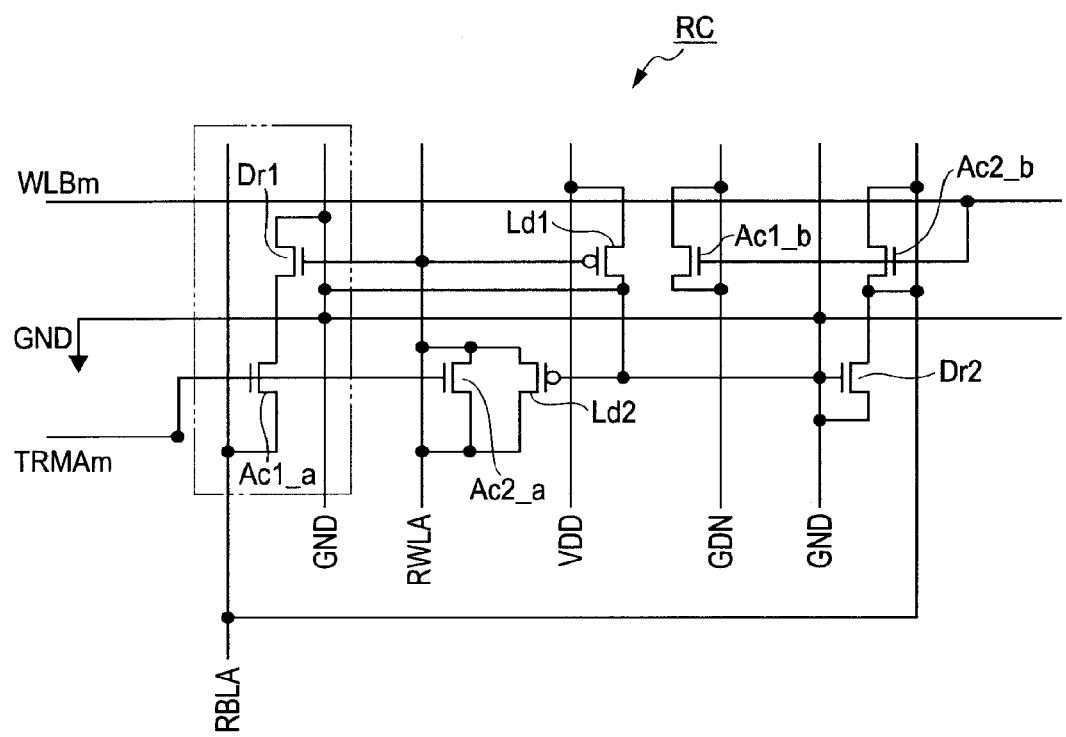
FIG. 4 is a circuit diagram illustrating an example of a replica cell RC having transistor placement equivalent to the transistor placement of the memory cell MC.

As shown in FIG. 4, the replica cell RC has transistor placement equivalent to that of the memory cell MC in FIG. 3. In FIG. 4, MOS transistors as components of the replica cell RC are the same as the MOS transistors as components of the memory cell MC shown in FIG. 3, and the same reference numerals are designated to the corresponding MOS transistors. The different point between the memory cell MC and the replica cell RC is the coupling relations of the MOS transistors configuring the cells.

Originally, the replica cell RC is a device provided to reproduce the current characteristic of the memory cell MC influenced by process variations. Consequently, as a path realizing current of the memory cello, in the replica cell RC on the first access port side, a path coupling the transistors Ac1_a and Dr1 and the ground voltage GND is used. In FIG. 4, the gate of the transistor Ac1_a is coupled to a trimming signal TRMG, and the gate of the transistor Dr1 is coupled to the replica word line RWLA. In the other transistors Ac2_a, Ld2, Ld1, Ac1_b, Ac2_b, and Dr2, short-circuit between the drain and source and the like are performed so that the transistors enter the cutoff state at the time of timing generating operation.

As described above, the replica bit line RBLA has the wiring structure that parallel lines having length obtained by cutting the non-inversion bit line BLAi and the inversion bit line /BLAi of the complementary bit lines in half are mutually short-circuited. Consequently, the wiring resistance, wiring capacitance, and parasitic capacitance of the source and drain of the MOS transistor are similar to those of the complementary bit lines BLAi and /BLAi. The characteristic of discharging the charges preliminarily accumulated in the replica bit line RBLA in FIG. 4 toward the ground voltage GND via the MOS transistors Ac1_a and Dr1 can be made similar to that of discharging the charges preliminarily accumulated in the non-inversion bit line BLAi in FIG. 3 toward the ground voltage GND via the MOS transistors Ac1_a and Dr1. The parasitic capacitance by the source and drain in the MOS transistor Ac2_b in FIG. 4 is doubled as compared with that in FIG. 3. This is resulted from short-circuiting of the source and drain of the MOS transistor Ac2_b so that the transistor Ac2_b does not undesirably turn on even when the word line WLBm on the second access port side becomes the selection level in the precharge state of the replica bit line RBLA. By considering this, even the parasitic capacitance by the source and drain of the MOS transistor Ac2_b increases, it works in the direction of increasing discharge time, that is, the direction of increasing the operation margin for the internal timing signal generated by the timing controller. Moreover, the ratio is extremely low, so that erroneous operation is not caused. Although WLAm is not shown in FIG. 4, obviously, the word line selection signal is transmitted to a memory cell at a far end via a not-shown aluminum line.

Although not shown, the replica cell RC on the second access port side is different with respect to the point that the current discharging path formed by the MOS transistors Ac1_a and Dr1 in FIG. 4 is formed by the MOS transistors Ac2_b and Dr2.

<Replica Block>

Figure 5:
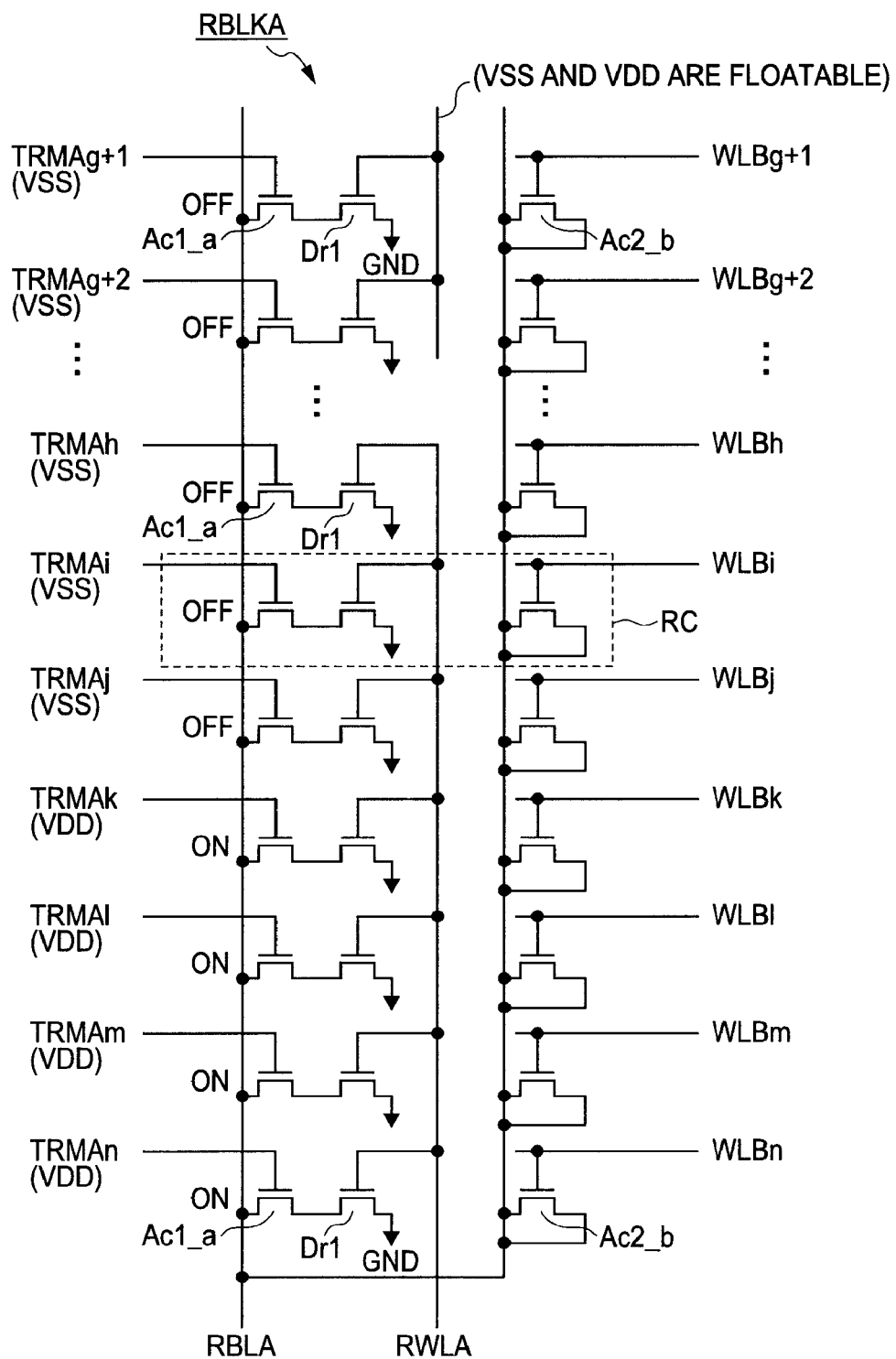
FIG. 5 is a circuit diagram illustrating a replica block RBLKA on a first access port side.
Figure 6:
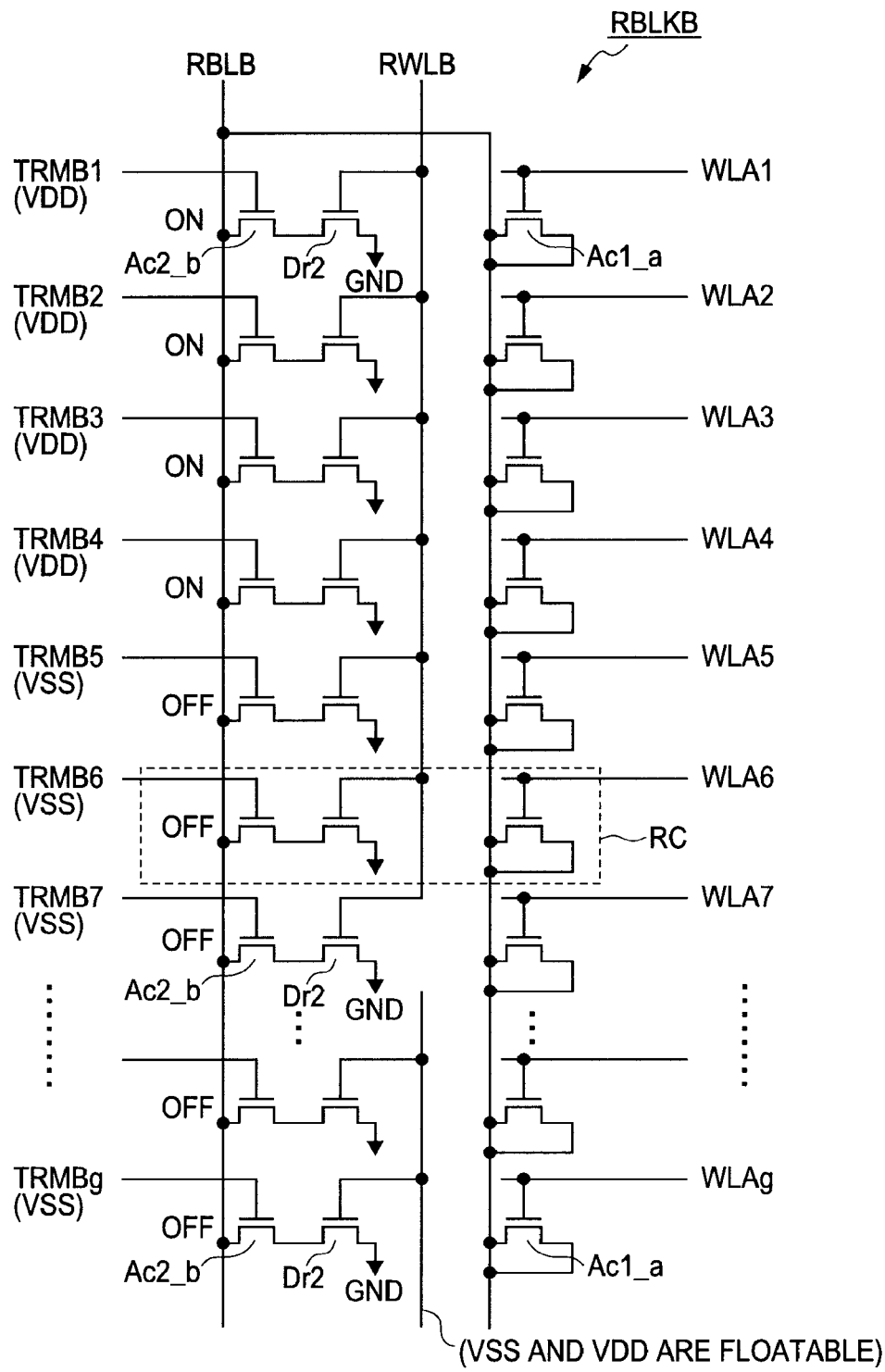
FIG. 6 is a circuit diagram illustrating a replica block RBLKB on a second access port side.

FIG. 5 illustrates the replica block RBLKA on the first access port side, and FIG. 6 illustrates the replica block RBLKB on the second access port side.

In FIG. 5, the MOS transistors Ac1_a, Dr1, and Ac2_b of each replica cell RC are representatively shown, and (n-g) pieces of replica cells RC are coupled to the replica bit line RBLA. The trimming signals TRMAn to TRMAg+1 are supplied to the gates of the MOS transistors Ac1_a in the replica cells RC. The replica word line RWLA is coupled to the gates of the MOS transistors Dr1 in n-(h−1) pieces of replica cells RC from the base end side of the replica bit line RBLA out of the (n-g) pieces of the replica cells RC. For example, the gates of the MOS transistors Dr1 in the remaining (h-g) pieces of replica cells RC are pulled down to the ground voltage and set in the cutoff state. The trimming signals TRMAn to TRMAg+1 are generated by a fuse program circuit programmed according to a result of a device test. The larger the number of the MOS transistors Ac1_a which are turned on by the trimming signals TRMAn to TRMAg+1 is, the shorter the time required to discharge the charges in the precharged replica bit line RBLA via the MOS transistors Dr1 becomes. The power of driving each of the trimming signals TRMAn to TRMAg+1 is naturally smaller than that of driving each of the word lines by the word driver 5 for the reason that it is sufficient to discharge the replica bit line RBLA by using a plurality of replica cells RC in parallel. As will be described later, according to the margin amount of the timing signals generated on the basis of the discharge, the number of MOS transistors Ac1_a to be turned on is determined. In the example of FIG. 5, as shown in the diagram, the replica word line RWLA may be extended to the transistor Dr1 coupled to the MOS transistor Ac1_a corresponding to a trimming signal RTMAh having the largest margin adjustment amount by the trimming signals TRMAn to TRMAg+1. The trimming signal of the replica cell is not only generated (stored) in the fuse program circuit but may be also stored in a nonvolatile memory which can hold data even after return from power shutdown and, as necessary, may be read.

In FIG. 6, the MOS transistors Ac2_a, Dr1, and Ac1_a of each replica cell RC are representatively shown, and "g" pieces of replica cells RC are coupled to the replica bit line RBLB. The trimming signals TRMB1 to TRMBg are supplied to the gates of the MOS transistors Ac2_b in the replica cells RC. The replica word line RWLB is coupled to the gates of the MOS transistors Dr2 in, for example, seven replica cells RC from the base end side of the replica bit line RBLB out of the "g" pieces of the replica cells RC. For example, the gates of the MOS transistors Dr2 in the remaining g-(7−1) pieces of replica cells RC are pulled down to the ground voltage and set in the cutoff state. The trimming signals TRMB1 to TRMB7 are generated by a fuse program circuit programmed according to a result of a device test. The larger the number of the MOS transistors Ac2_b which are turned on by the trimming signals TRMB1 to TRMB7 is, the shorter the time required to discharge the charges in the precharged replica bit line RBLB via the MOS transistors Dr2 becomes. The power of driving each of the trimming signals TRMB1 to TRMBg is naturally smaller than that of driving each of the word lines by the word driver 6 for the reason that it is sufficient to discharge the replica bit line RBLB by using a plurality of replica cells RC in parallel. As will be described later, according to the margin amount of the timing signals generated on the basis of the discharge, the number of MOS transistors Ac2_b to be turned on is determined. In the example of FIG. 6, as shown in the diagram, the replica word line RWLB may be extended to the transistor Dr2 coupled to the MOS transistor Ac2_b corresponding to a trimming signal RTMB7 having the largest margin adjustment amount by the trimming signals TRMB1 to TRMBg.

<Generation of Internal Timing using Replica Cell>

The base end of the replica bit line RBLA is coupled to the timing controller of the memory control unit 3, and the discharging timing is used for generation of a predetermined internal timing signal in the memory access operation on the first access port side. Similarly, the base end of the replica bit line RBLB is coupled to the timing controller of the second memory control unit 4, and the discharging timing is used for generation of a predetermined internal timing signal in the memory access operation on the second access port side. For example, it is used for generation of a sense amplifier activate signal that activates the sense amplifier in the reading operation.

Figure 7:
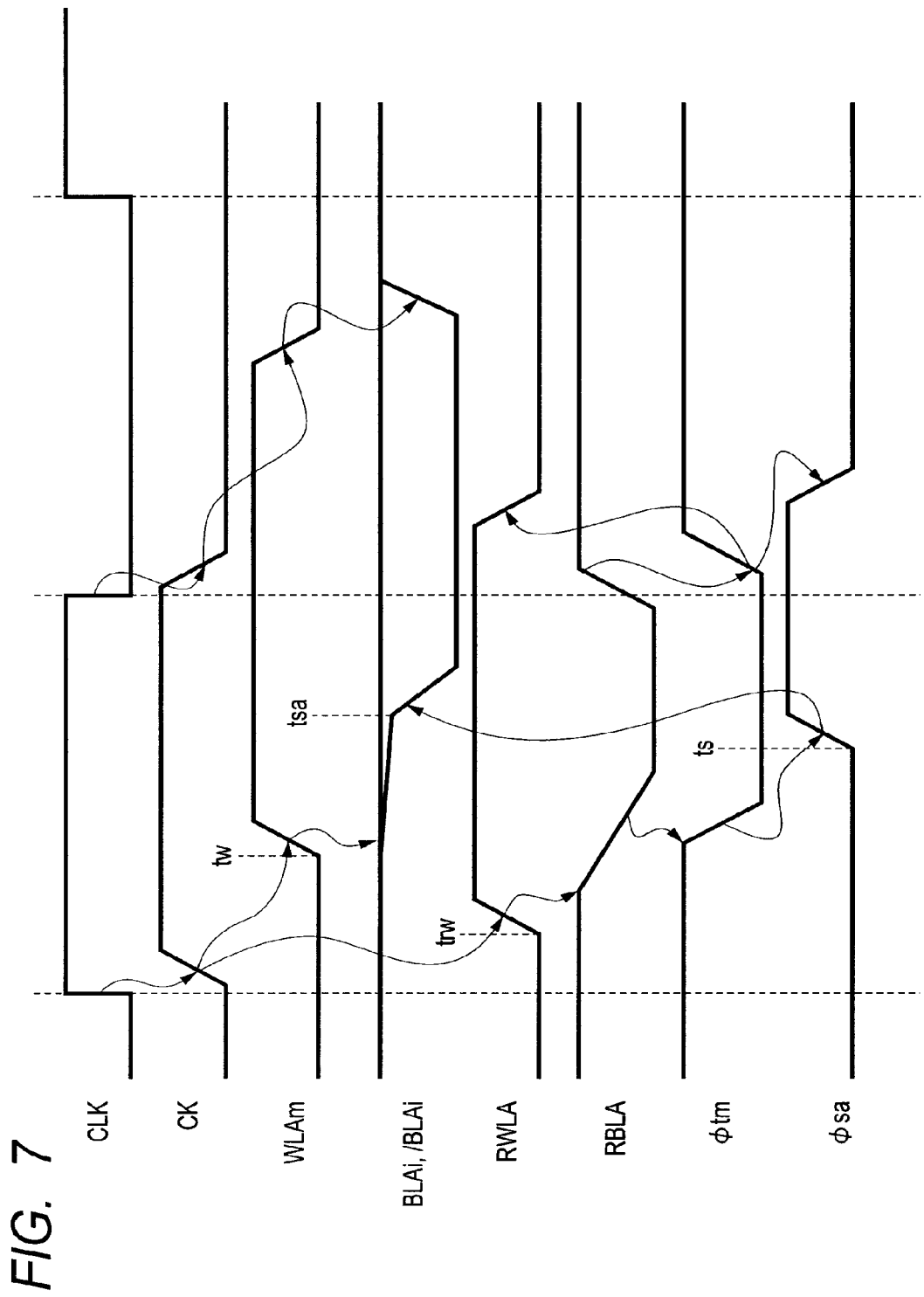
FIG. 7 is a timing chart illustrating a timing of generating a sense amplifier activate signal in operation of reading data from the first access port.

FIG. 7 shows the timings of generating the sense amplifier activate signal in the operation of reading data from the first access port.

In FIG. 7, the reading operation is synchronized with the clock signal CLK and one read cycle is formed by two cycles of the clock signal CLK. CK denotes an internal clock signal (for a memory) synchronized with the external clock signal CLK. When reading operation is instructed, the not-shown timing controller in the first memory control circuit 3 generates the timing of selecting the word lines WLA1 to WLAn synchronously with the clock signal CK, and drives one word line designated by a row address, for example, the word line WLAm to the selection level (time tw). When the memory cell MC is selected, the potential difference is complementarily generated between the complementary bit lines BLA1 and /BLA1 precharged to the power supply voltage in accordance with information stored in the memory cell MC. At time trw before time tw at which selection of the word line starts, the first memory control circuit 3 drives the replica word line RWLA to the selection level and, synchronously, discharging of the replica bit line RBLA precharged to the power supply voltage starts. The discharge speed is proportional to the number of the MOS transistors Ac1_a which are turned on by the trimming signals TRMAn to TRMAg+1. The timing controller detects that the voltage of the replica bit line RBLA reaches predetermined threshold voltage and generates an internal timing pulse φtm. Synchronously with a change in the internal timing pulse φtm, a sense amplifier activate signal φsa is activated by a predetermined logic circuit (tse). Synchronously, operation of sense amplifying the potential difference of the complementary bit lines BLAi and /BLAi for memory cells by the sense amplifier starts (tsa). Therefore, by adjusting the number of MOS transistors Ac1_$a$ which are turned on by the trimming signals TRMAn to TRMAg+1 in accordance with the current characteristic of the memory cell MC due to process variations, after the potential difference of the complementary bit lines BLAi and /BLAi reaches the operation point of the sense amplifier, the sense amplifier can be activated. Without setting an excessive operation margin, erroneous reading operation can be suppressed.

<Chip Occupation Area of DPSRAM>

Figure 8:
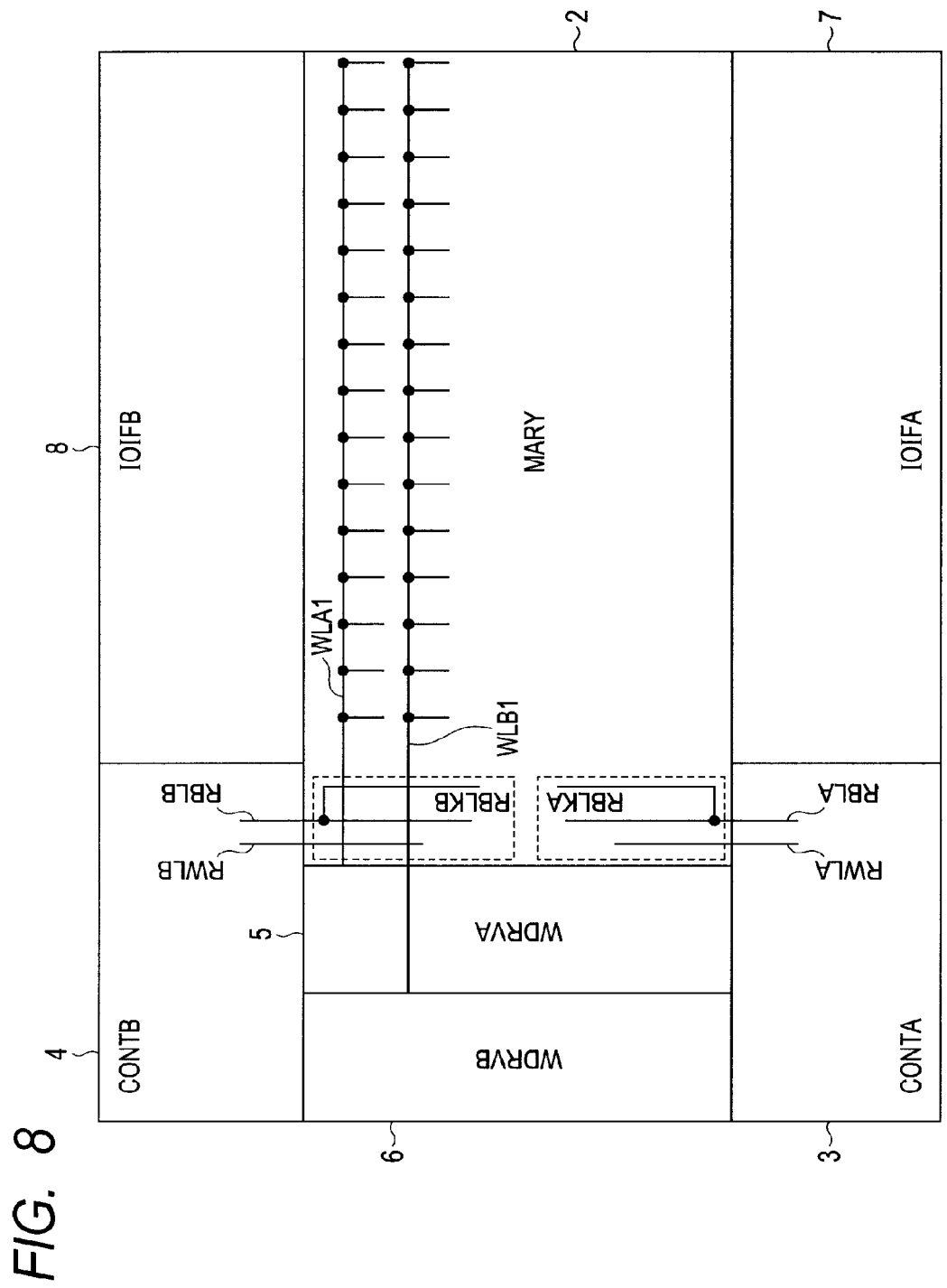
FIG. 8 is an explanatory diagram showing block layout of a DPSRAM.

FIG. 8 shows the block layout of the DPSRAM 1. As described above, the replica block RBLKA on the first port side and the replica block RBLKB on the second port side occupy a region where a pair of complementary bit lines is disposed.

Figure 9:
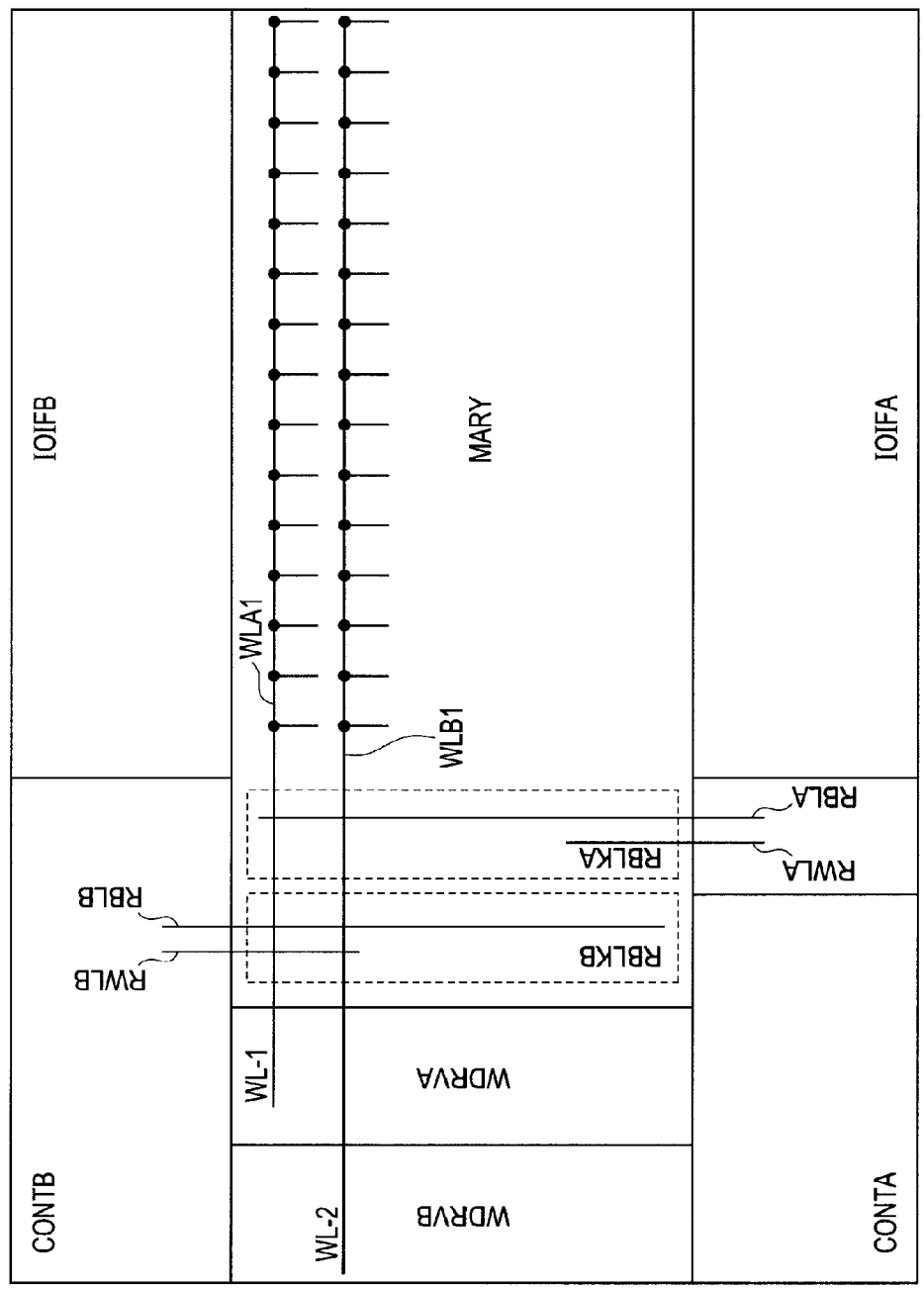
FIG. 9 is an explanatory diagram showing block layout of the case, as a comparative example, where a replica bit line is formed only by the wiring structure of either a non-inversion bit line or an inversion bit line in complementary bit lines.

FIG. 9 shows, as a comparative example, the case of forming the replica bit line only by the line structure of either the non-inversion bit line or the inversion bit line in the complementary bit line. In this case, each of the replica block RBLKA on the first access port side and the replica block RBLKB on the second access port side occupies the region where a pair of complementary bit lines is disposed, and the occupancy area of the replica block is twice as large as that of FIG. 8. Therefore, the DPSRAM of FIG. 9 is longer than that of FIG. 8 in the lateral direction (the word line direction) and its occupancy area increases. In the block layout of FIG. 8, it is considered to prevent the shape from becoming long in the word line direction by disposing the external input/output circuits 7 and 8 and the memory control circuits 3 and 4 on the first and second access ports, respectively, on the upper and lower sides in the word line direction of the memory cell array. FIG. 9 is similar to FIG. 8 in this respect but cannot maximize the effect in the configuration of the replica blocks RBLKA and RBLKB. Further, by disposing the circuits as described above, the memory block layout becomes a rectangular shape where the difference among four sides is relatively small and which is easily laid out.

Figure 10:
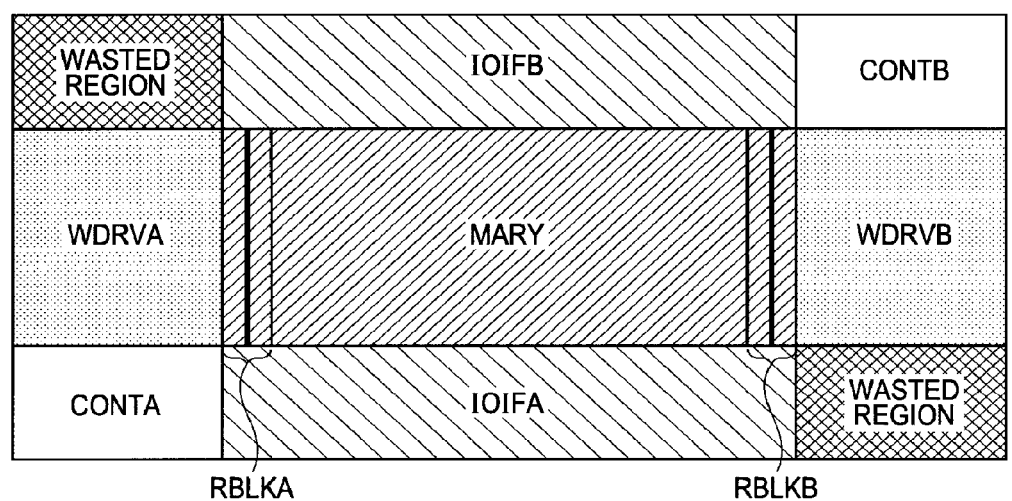
FIG. 10 is an explanatory diagram of block layout as a comparative example in which external input/output circuits and memory control circuits are disposed for first and second access ports on upper and lower sides, respectively, in the word line direction of a memory cell array, and memory control circuits and word drivers are disposed on both sides of the memory cell array.

FIG. 10 shows, as a comparative example, the block layout in which external input/output circuits IOIFA and IOIFB and memory control circuits CONTA and CONTB are disposed on the first and second access port sides, respectively, on the upper and lower sides in the word line direction of the memory cell array. The memory control circuits CONTA and CONTB and the word drivers WDRVA and WDRVB are disposed on both sides of the memory cell array MARY. In this case, a wasted region (a region in which a circuit necessary for the memory operation is not mounted) is generated. Therefore, by employing the configuration that each of the replica bit block RBLKA on the first port side and the replica bit block RBLKB on the second port side occupies the region in which a pair of complementary bit lines is occupied, the effect of reducing the area is less.

Figure 11:
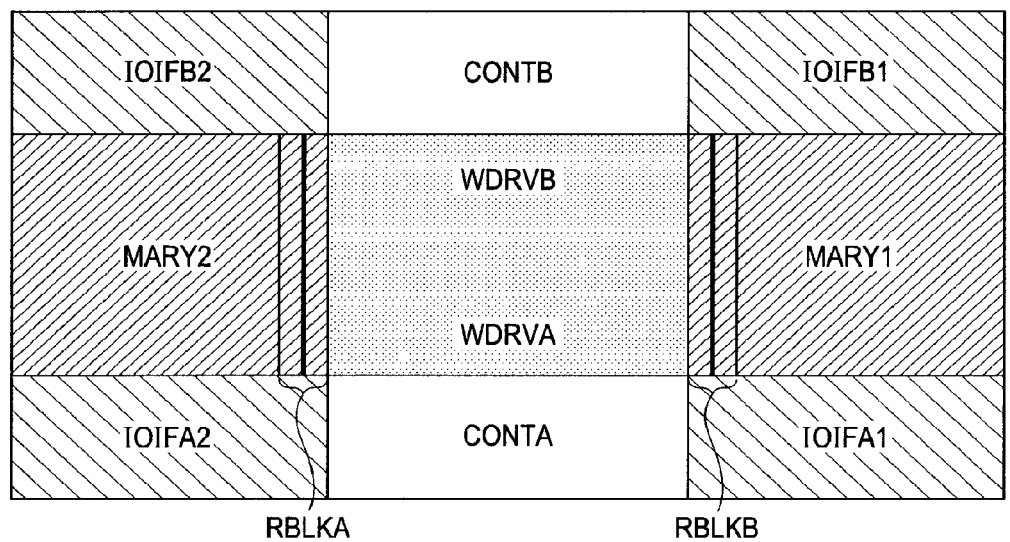
FIG. 11 is an explanatory diagram of block layout according to a comparative example in which a memory cell array is divided into right and left parts.
Figure 12:
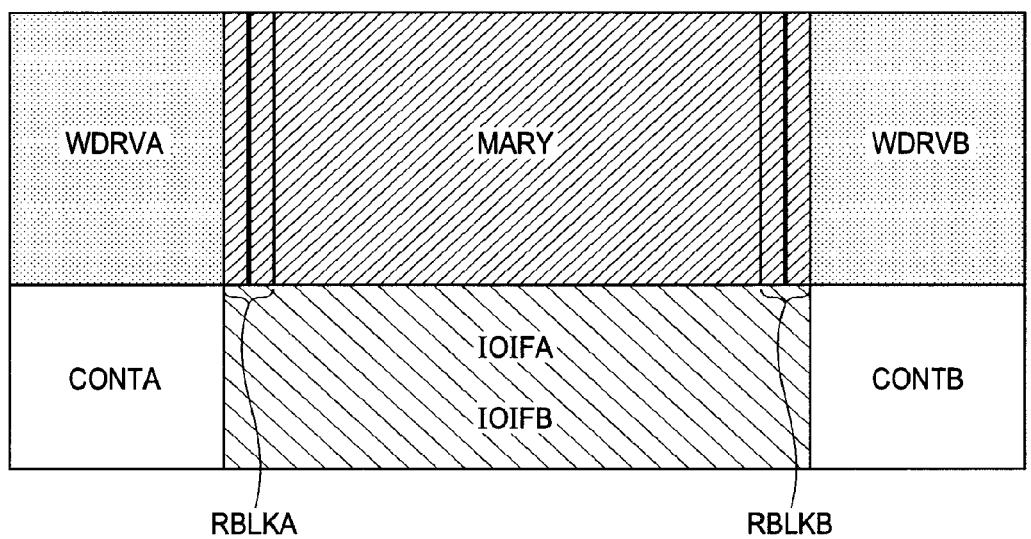
FIG. 12 is an explanatory diagram of block layout showing a comparative example in which the memory control circuits and the external input/output circuits are not divided to upper and lower sides in the word line direction of the memory cell array.

The block layout according to a comparative example of FIG. 11 is an example of dividing the memory cell array to right and left parts. The block layout according to a comparative example of FIG. 12 is an example where the memory control circuits CONTA and CONTB and the external input/output circuits IOIFA and IOIFB are not divided to upper and lower parts in the word line direction of the memory cell array. In each of the cases, the occupied area further increases.

Therefore, the most excellent block layout for reduction in occupied area is that, as shown in FIG. 8, the external input/output circuits 7 and 8 and the memory control circuits 3 and 4 are disposed on the first and second access ports on the upper and lower sides, respectively, in the word line direction of the memory cell array 2 and, moreover, the memory control circuits 3 and 4 and the word drivers 5 and 6 are disposed on one side of the memory cell array 2 and the replica block RBLKA on the first access port side and the replica block RBLKB on the second access port side are disposed in the region where a pair of complementary bit lines is disposed. Although not shown, it is also considered to dispose only the replica block RBLKB on the opposite side of the memory cell array 2 in the block layout of FIG. 8 to nest the memory cells at ends of the memory cell array. In this case, however, the replica bit line RBLB of the replica block RBLKB has to be extended to the timing controller of the memory control circuit 4 on the opposite side. It requires increase in the area due to the extension and consideration of making settings by trimming signals different from each other in order to synchronize an internal timing generated by using the replica block RBLKB and an internal timing generated by the replica block RBLKA.

<Semiconductor Integrated Circuit>

Although the DPSRAM 1 can be realized as a single-body semiconductor device, it can be also mounted on a semiconductor device for data processing such as a microcomputer.

Figure 13:
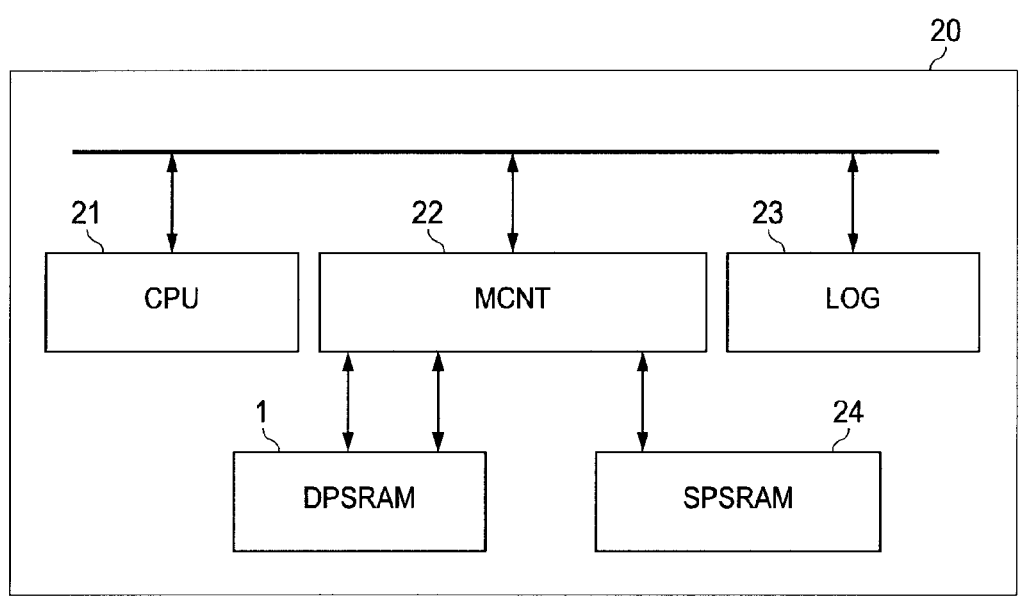
FIG. 13 is a block diagram showing a microcomputer as an example of the semiconductor device according to the present invention.

FIG. 13 illustrates a microcomputer 20 as an example of the semiconductor device. The microcomputer 20 is formed on a single semiconductor substrate made of single-crystal silicon or the like by the complementary MOS integrated circuit manufacturing technique. The microcomputer 20 has a central processing unit (CPU) 21, a memory controller (MCNT) 22, the DPSRAM 1, a single-port SRAM (SPSRAM) 24, and other logic circuits (LOG) 23, and the like as circuit modules to be controlled by the CPU 21. The DPSRAM 1 and the SPSRAM 24 are coupled to the memory controller 22, and the memory controller 22 is coupled together with the CPU 21 and the other logic circuits 23 to an internal bus 25. The memory controller 22 performs, for example, control of making the DPSRAM 1 and the SPSRAM 24 operate as cache memories or main memories.

On the microcomputer 20, various circuit modules are mounted according to functions to be provided on a chip. Although only one DPSRAM 1 is shown here, in the case where a plurality of circuit modules need the DPSRAM 1, DPSRAMs satisfying the required storage capacity are eccentrically distributed. The DPSRAM 1 and the single-port SRAM (SPSRAM) 24 do not always have to be coupled to the internal bus via the memory controller but may be directly coupled to the internal bus. An on-chip SRAM is designed by using a design support tool such as a memory compiler. The size varies according to the storage capacity. In the case of eccentrically mounting a plurality of DPSRAMs of different sizes on a single semiconductor chip, as shown in the block layout of FIG. 8, even the effect of reducing the occupation area of the replica blocks RBLKA and RBLKB in a single DPSRAM is small, large effect of reducing the occupation area can be obtained on the entire chip.

Although the present invention achieved by the inventors herein has been concretely described on the basis of the embodiment, obviously, the invention is not limited to the embodiment but may be variously changed without departing from the gist.

For example, although the sense amplifier activate signal is used as an example of the internal timing signal generated by using the replica block in the above description, the invention is not limited to the sense amplifier activate signal. The invention can be applied to generation of another proper internal timing signal.

The dual-port memory circuit which can function in generation of an internal timing is not limited to an SRAM but may be a memory of another storage type.

The semiconductor device is not limited to a memory single-body LSI and a microcomputer LSI but can be widely applied to a system-on-chip semiconductor device, a module obtained by mounting a plurality of LSIs in a package, and the like.

It is sufficient to determine the length of a replica bit line in the invention by paying attention to wiring capacitance and parasitic capacitance in a bit line unit basis selected at the time of an access. The wiring capacitance and the parasitic capacitance of the replica bit line do not have to completely match with those of a corresponding bit line. Variations in a delay component can be absorbed by selection with a trimming signal.

What is claimed is:

1. A semiconductor device comprising:
   a memory cell array;
   a first memory control unit;
   a first word driver;
   a first input/output circuit unit;
   a second memory control unit;
   a second word driver; and
   a second input/output circuit unit,
   wherein the memory cell array includes:
   first word lines coupled to the first word driver;
   first complementary bit lines coupled to the first input/output circuit unit;
   second word lines coupled to the second word driver;
   second complementary bit lines coupled to the second input/output circuit unit;
   a plurality of memory cells coupled to the first complementary bit lines, the first word lines, the second complementary bit lines, and the second word lines;
   a first replica word line coupled to the first word driver;
   a first replica bit line coupled to the first input/output circuit unit;
   a second replica word line coupled to the second word driver;
   a second replica bit line coupled to the second input/output circuit unit; and
   a plurality of replica cells coupled to the first replica bit lines, the first replica word lines, the second replica bit lines, and the second word lines;
   wherein the first replica bit line has a wiring structure that parallel lines having length obtained by cutting an inversion bit line and a non-inversion bit line of the first complementary bit lines in half are coupled, and
   wherein the second replica bit line has a wiring structure that parallel lines having length obtained by cutting an inversion bit line and a non-inversion bit line of the second complementary bit lines in half are coupled.

2. The semiconductor device according to claim 1, wherein the first replica bit line and the second replica bit line are disposed at one end in the longitudinal direction of the memory cell array.

3. The semiconductor device according to claim 2, wherein the memory cells are static memory cells.

4. The semiconductor device according to claim 3, wherein the first memory control unit generates a first internal timing signal based on a level change in the first replica bit line, caused by selection of the first replica word line before a timing of selecting a first word line when reading operation is instructed, and
   wherein the second memory control unit generates a second internal timing signal based on a level change in the second replica bit line, caused by selection of the second replica word line before a timing of selecting a second word line when reading operation is instructed.

5. The semiconductor device according to claim 4, wherein the first internal timing signal is a signal of determining a timing of starting a sense amplifying operation of a first complementary bit line, and
   wherein the second internal timing signal is a signal of determining a timing of starting a sense amplifying operation of a second complementary bit line.

6. The semiconductor device according to claim 3, further comprising a central processing unit that accesses the memory cell array.

* * * * *